(12) United States Patent
Cao et al.

(10) Patent No.: US 8,443,307 B2
(45) Date of Patent: May 14, 2013

(54) METHODS AND SYSTEM FOR MODEL-BASED GENERIC MATCHING AND TUNING

(75) Inventors: Yu Cao, Cupertino, CA (US); Hanying Feng, Fremont, CA (US); Jun Ye, Palo Alto, CA (US)

(73) Assignee: ASML Netherlands B.V., Veldhoven (NL)

( * ) Notice: Subject to any disclaimer, the term of this patent is extended or adjusted under 35 U.S.C. 154(b) by 429 days.

(21) Appl. No.: 12/613,285

(22) Filed: Nov. 5, 2009

(65) Prior Publication Data

US 2010/0146475 A1    Jun. 10, 2010

Related U.S. Application Data

(60) Provisional application No. 61/113,024, filed on Nov. 10, 2008.

(51) Int. Cl.
*G06F 17/50* (2006.01)
*G03B 27/42* (2006.01)
*G03B 27/54* (2006.01)
*G03B 27/58* (2006.01)

(52) U.S. Cl.
USPC ............ 716/50; 716/51; 716/52; 716/53; 716/54; 716/55; 716/56; 355/53; 355/67; 355/74

(58) Field of Classification Search . 716/50–56; 355/53, 355/67, 74, 77
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 6,046,792 A | 4/2000 | Van Der Werf et al. | |
| 6,738,859 B2 | 5/2004 | Liebchen | |

(Continued)

FOREIGN PATENT DOCUMENTS

| EP | 1 202 119 | 5/2002 |
|---|---|---|
| EP | 1 696 269 | 8/2006 |

(Continued)

OTHER PUBLICATIONS

Grosman et al.; "Yield enhancement in photolithography through model-based process control: average mode control"; Publication Year: 2005; Semiconductor Manufacturing, IEEE Transactions on; vol. 18, Issue: 1; pp. 86-93.*

(Continued)

*Primary Examiner* — Helen Rossoshek
(74) *Attorney, Agent, or Firm* — Pillsbury Winthrop Shaw Pittman LLP

(57) ABSTRACT

The present invention relates to a method for tuning lithography systems so as to allow different lithography systems to image different patterns utilizing a known process that does not require a trial and error process to be performed to optimize the process and lithography system settings for each individual lithography system. According to some aspects, the present invention relates to a method for a generic model-based matching and tuning which works for any pattern. Thus it eliminates the requirements for CD measurements or gauge selection. According to further aspects, the invention is also versatile in that it can be combined with certain conventional techniques to deliver excellent performance for certain important patterns while achieving universal pattern coverage at the same time.

18 Claims, 6 Drawing Sheets

U.S. PATENT DOCUMENTS

| | | | |
|---|---|---|---|
| 6,795,163 B2 | 9/2004 | Finders | |
| 6,977,714 B2 | 12/2005 | Finders | |
| 7,079,223 B2 | 7/2006 | Rosenbluth et al. | |
| 7,116,411 B2* | 10/2006 | Park et al. | 356/124 |
| 7,242,459 B2 | 7/2007 | Shi et al. | |
| 7,245,354 B2 | 7/2007 | Granik | |
| 7,245,356 B2* | 7/2007 | Hansen | 355/67 |
| 7,251,807 B2 | 7/2007 | Melvin, III et al. | |
| 7,262,831 B2* | 8/2007 | Akhssay et al. | 355/52 |
| 7,297,453 B2* | 11/2007 | Watson et al. | 430/30 |
| 7,374,957 B2* | 5/2008 | Oesterholt | 438/14 |
| 7,425,397 B2 | 9/2008 | Finders et al. | |
| 7,440,082 B2 | 10/2008 | Shi et al. | |
| 7,488,933 B2* | 2/2009 | Ye et al. | 250/252.1 |
| 7,587,704 B2* | 9/2009 | Ye et al. | 716/51 |
| 7,617,477 B2* | 11/2009 | Ye et al. | 716/56 |
| 7,626,684 B2* | 12/2009 | Jeunink et al. | 355/77 |
| 7,646,906 B2* | 1/2010 | Saidin et al. | 382/144 |
| 7,652,758 B2* | 1/2010 | Park et al. | 356/124 |
| 7,653,890 B2* | 1/2010 | Tsai et al. | 716/55 |
| 7,747,978 B2* | 6/2010 | Ye et al. | 716/50 |
| 7,853,920 B2* | 12/2010 | Preil et al. | 716/52 |
| 7,873,204 B2 | 1/2011 | Wihl et al. | |
| 7,962,863 B2* | 6/2011 | Su et al. | 716/50 |
| 7,999,920 B2* | 8/2011 | Ye et al. | 355/77 |
| 8,006,203 B2* | 8/2011 | Fan et al. | 716/54 |
| 8,040,573 B2* | 10/2011 | Shi et al. | 358/406 |
| 8,056,028 B2* | 11/2011 | Cao et al. | 716/55 |
| 8,065,636 B2* | 11/2011 | Ye et al. | 716/50 |
| 8,102,408 B2* | 1/2012 | Verma et al. | 346/87 |
| 2002/0062206 A1 | 5/2002 | Liebchen | |
| 2002/0154281 A1 | 10/2002 | Finders | |
| 2004/0012775 A1 | 1/2004 | Kinney et al. | |
| 2005/0024616 A1 | 2/2005 | Finders | |
| 2005/0168498 A1 | 8/2005 | Granik | |
| 2005/0179886 A1 | 8/2005 | Shi et al. | |
| 2005/0185159 A1 | 8/2005 | Rosenbluth et al. | |
| 2005/0240895 A1* | 10/2005 | Smith et al. | 716/19 |
| 2006/0044542 A1 | 3/2006 | Park et al. | |
| 2006/0077865 A1 | 4/2006 | Eytan et al. | |
| 2006/0190912 A1 | 8/2006 | Melvin, III et al. | |
| 2007/0002311 A1 | 1/2007 | Park et al. | |
| 2007/0059614 A1 | 3/2007 | Finders et al. | |
| 2007/0076180 A1* | 4/2007 | Tinnemans et al. | 355/53 |
| 2007/0247610 A1 | 10/2007 | Shi et al. | |
| 2008/0152212 A1 | 6/2008 | Feldman | |
| 2008/0170773 A1 | 7/2008 | Wihl et al. | |
| 2009/0024967 A1* | 1/2009 | Su et al. | 716/4 |
| 2009/0053628 A1* | 2/2009 | Ye et al. | 430/30 |
| 2009/0144691 A1* | 6/2009 | Rathsack et al. | 716/19 |
| 2009/0276751 A1* | 11/2009 | Cao et al. | 716/21 |
| 2009/0300573 A1* | 12/2009 | Cao et al. | 716/19 |
| 2010/0010784 A1* | 1/2010 | Cao et al. | 703/1 |
| 2010/0058263 A1* | 3/2010 | Tyminski et al. | 716/5 |
| 2010/0122225 A1* | 5/2010 | Cao et al. | 716/4 |
| 2011/0033887 A1* | 2/2011 | Fang et al. | 435/41 |
| 2011/0267597 A1* | 11/2011 | Ye et al. | 355/77 |
| 2012/0017183 A1* | 1/2012 | Ye et al. | 716/52 |
| 2012/0124529 A1* | 5/2012 | Feng et al. | 716/54 |

FOREIGN PATENT DOCUMENTS

| | | |
|---|---|---|
| EP | 1 719 019 | 11/2006 |
| JP | 2002-184688 | 6/2002 |
| JP | 2002-329645 | 11/2002 |
| JP | 2004-103674 | 4/2004 |
| JP | 2005-217430 | 8/2005 |
| JP | 2005-234571 | 9/2005 |
| JP | 2006-066925 | 3/2006 |
| JP | 2006-235600 | 9/2006 |
| JP | 2007-081393 | 3/2007 |
| JP | 2010114443 A * | 5/2010 |
| WO | 2005/078528 | 8/2005 |
| WO | 2008/086528 | 7/2008 |

OTHER PUBLICATIONS

Dusa, M.V.; "Effects of lens aberrations on critical dimension control in optical lithography"; Publication Year: 1997; Semiconductor Conference, 1997. CAS '97 Proceedings., 1997 International; vol. 2; pp. 425-429 vol. 2.*

Japanese Office Action dated Jan. 5, 2012 in corresponding Japanese Patent Application No. 2009-248677.

U.S. Office Action mailed May 31, 2012 in corresponding U.S. Appl. No. 12/614,180.

* cited by examiner

METHODS AND SYSTEM FOR MODEL-BASED GENERIC MATCHING AND TUNING

CROSS-REFERENCE TO RELATED APPLICATIONS

The present application claims priority to U.S. Prov. Appln. No. 61/113,024 filed Nov. 10, 2008, the contents of which are incorporated by reference herein in their entirety.

FIELD OF THE INVENTION

The technical field of the present invention relates generally to a method and system for performing model-based scanner tuning and optimization so as to allow for optimization of performance of multiple lithography systems for generic patterns.

BACKGROUND OF THE INVENTION

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

Another goal is to be able to utilize the same "process" for imaging a given pattern with different lithography systems (e.g., scanners) without having to expend considerable amounts of time and resources determining the necessary settings of each lithography system to achieve optimal/acceptable imaging performance. As is known, designers/engineers spend a considerable amount of time and money determining the optimal settings of a lithography system (e.g., scanner), which include numerical aperture (NA), $\sigma_{in}$, $\sigma_{out}$, etc., when initially setting up a given process to work with a particular scanner so that the resulting image satisfies the design requirements. Indeed, this is often a trial and error process wherein the scanner settings are selected and the desired pattern is imaged and then measured to determine if the resulting image is within specified tolerances. If not, the scanner settings are adjusted and the pattern is imaged once again and measured. This process is repeated until the resulting image is within the specified tolerances.

However, as each scanner, even identical model types, exhibit different optical proximity effects (OPEs) when imaging a pattern, the actual pattern imaged on the substrate differs from scanner to scanner due to the different OPEs. For example, different OPEs associated with given scanners can introduce significant CD variations through pitch. As such, it is not possible to simply utilize either scanner to image a given pattern, as the resulting image can vary considerably. Thus, if it is desirable to utilize a different scanner to print a given pattern, the engineers must optimize or tune the new scanner, so that the resulting image satisfies the design requirements. Currently, this is typically accomplished by a trial and error process, which as noted above, is both expensive and time consuming.

Some automated approaches have been developed, such as model-based matching and tuning (see U.S. patent application Ser. No. 11/892,407 filed Aug. 22, 2007, the contents of which are incorporated by reference herein). Model-based matching and tuning rely on metrology to measure CDs and/or selection of certain gauges. This may be very time consuming and expensive. It is also pattern specific, that is, there is no guarantee of matching for patterns not selected.

SUMMARY OF THE INVENTION

Accordingly, the present invention relates to a method for tuning lithography systems so as to allow different lithography systems to image different patterns utilizing a known process that does not require a trial and error process to be performed to optimize the process and lithography system settings for each individual lithography system. According to some aspects, the present invention relates to a method for a generic model-based matching and tuning which works for any pattern. Thus it eliminates the requirements for CD measurements or gauge selection. According to further aspects, the invention is also versatile in that it can be combined with certain conventional techniques to deliver excellent performance for certain important patterns while achieving universal pattern coverage at the same time.

In furtherance of these and other aspects, a method of tuning a to-be-tuned lithographic process to a reference lithographic process according to embodiments of the invention includes obtaining respective lithographic process models for both the reference lithographic process and the to-be-tuned lithographic process; identifying a set of tunable parameters of the to-be-tuned lithographic process; determining responses of the to-be-tuned lithographic process model to changes in the set of tunable parameters; determining optimal changes in the tunable parameters that cause the lithographic process models to match; and adjusting the model for the to-be-tuned lithographic process based on the determined optimal changes.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

Figure 1:
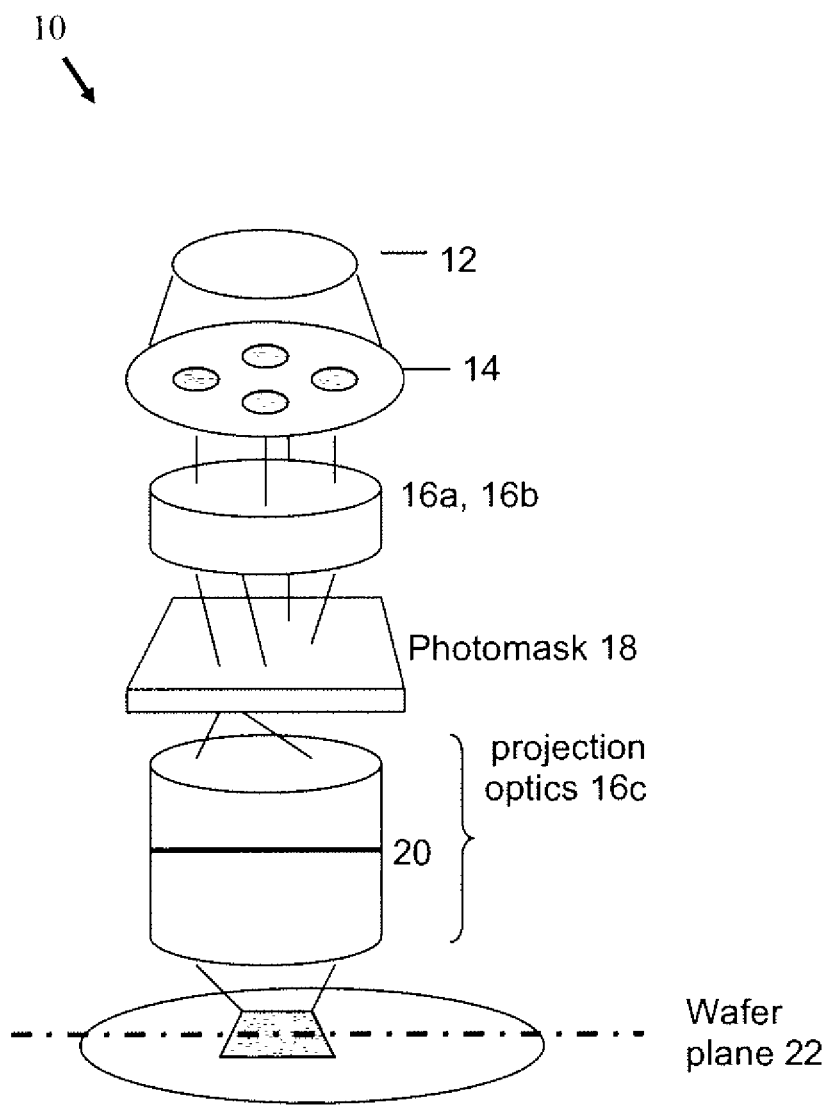
FIG. 1 is an exemplary block diagram illustrating a typical lithographic projection system.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Prior to discussing the present invention, a brief discussion regarding the overall simulation and imaging process is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin ($\Theta_{max}$).

Figure 2:
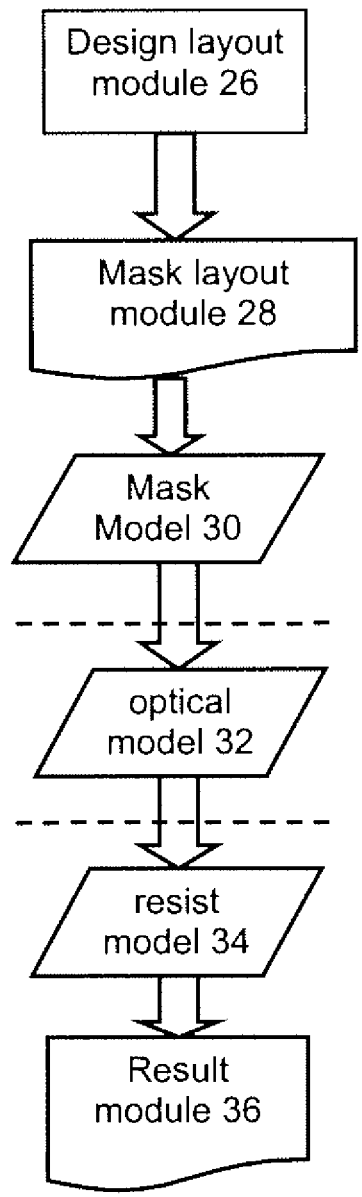
FIG. 2 is an exemplary block diagram illustrating the functional modules of a lithographic simulation model.

In a lithography simulation system, these major system components can be described by separate functional modules, for example, as illustrated in FIG. 2. Referring to FIG. 2, the functional modules include the design layout module 26, which defines the target design; the mask layout module 28, which defines how the mask is laid out using the target design to be utilized in the imaging process; the mask model module 30, which models the properties of the physical mask to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model module 32 that includes, but is not limited to, NA-sigma ($\sigma$) settings as well as any particular illumination source shape, where $\sigma$ (or sigma) is outer radial extent of the illuminator. The optical properties of the photo-resist layer coated on a substrate—i.e. refractive index, film thickness, propagation and polarization effects—may also be captured as part of the optical model module 32, whereas the resist model module 34 describes the effects of chemical processes which occur during resist exposure, PEB and development, in order to predict, for example, contours of resist features formed on the substrate wafer. The mask model module 30 captures how the target design features are laid out in the reticle and may also include a representation of detailed physical properties of the mask, as described, for example, in U.S. patent application Ser. No. 10/530,402. The objective of the simulation is to accurately predict, for example, edge placements and critical dimensions (CDs), which can then be compared against the target design. The target design is generally defined as the pre-OPC mask layout, and will be provided in a standardized digital file format such as GDSII or OASIS.

In general, the connection between the optical and the resist model is a simulated aerial image intensity within the resist layer, which arises from the projection of light onto the substrate, refraction at the resist interface and multiple reflections in the resist film stack. The light intensity distribution (aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

Model-Based Matching and Tuning

According to some general aspects, the present invention involves using one reference model (Model-R, which stands for Model-Reference), to tune another scanner (Scanner-T, which stands for Scanner-to-be-Tuned) so that Scanner-T's behavior matches the behavior of Model-R as much as possible. The reference model can represent the behavior of another physical scanner or it can be a virtual scanner. It is also assumed that all the characteristics of Scanner-T can be completely captured by a model, denoted as Model-T, which stands for Model-to-be-Tuned. Thus, scanner matching and tuning becomes the problem of manipulating Model-T so that its behavior matches the behavior of Model-R as much as possible. These aspects and applications will be elaborated on below.

Minimizing AI Difference

A commonly used performance measurement for matching is the RMS of contour-to-contour distance, which is strongly correlated with the RMS of aerial image (AI) intensity difference. Therefore, one can minimize the RMS of AI intensity difference to achieve desired matching/tuning results.

In particular, according to the known Hopkins theory, the aerial image intensity may be defined by:

$$I(x) = \sum_{k} \left| A(k) \sum_{k'} M(k'-k)P(k')\exp(-jk'x) \right|^2 \quad \text{(Eq. 1)}$$

$$= \sum_{k} A(k)^2 \left\{ \sum_{k'} \sum_{k''} M(k',k)P(k')M*\right.$$

$$\left. (k''-k)P*(k'')\exp(-j(k'-k'')x) \right\}$$

$$= \sum_{k'} \sum_{k''} \left[ \sum_{k} A(k)^2 P(k+k')P*(k+k'') \right]$$

$$M(k')M*(k'')\exp(-j(k'-k'')x)$$

$$= \sum_{k'} \sum_{k''} TCC(k',k'')M(k')M*(k'')\exp(-j(k'-k'')x)$$

where, I(x) is the aerial image intensity at point x within the image plane (for notational simplicity, a two-dimensional coordinate represented by a single variable is utilized), k represents a point on the source plane, A(k) is the source amplitude from point k, k' and k" are points on the pupil plane, M is the Fourier transform of the mask image, P is the pupil function, and $$TCC(k',k'') = \sum_{k} A(k)^2 P(k+k')P^*(k+k''). \quad \text{(Eq. 2)}$$

A notable aspect of the foregoing derivation is the change of summation order (moving the sum over k inside) and indices (replacing k' with k+k' and replacing k" with k+k"), which results in the separation of the Transmission Cross Coefficients (TCCs), defined by the term inside the square brackets in the third line in the equation, from other terms. These coefficients are independent of the mask pattern and therefore can be pre-computed using knowledge of the optical elements or configuration only (e.g., NA and $\sigma$ or the detailed illuminator profile). It is further noted that although in the given example (Eq. 1) is derived from a scalar imaging model, this formalism can also be extended to a vector imaging model, where TE and TM polarized light components are summed separately.

It should be noted that the TCCs discussed in this application are the so called "raw" TCCs, which are different from the diagonalized TCCs used in other applications.

TCC-Based Matching/Tuning

Figure 3:
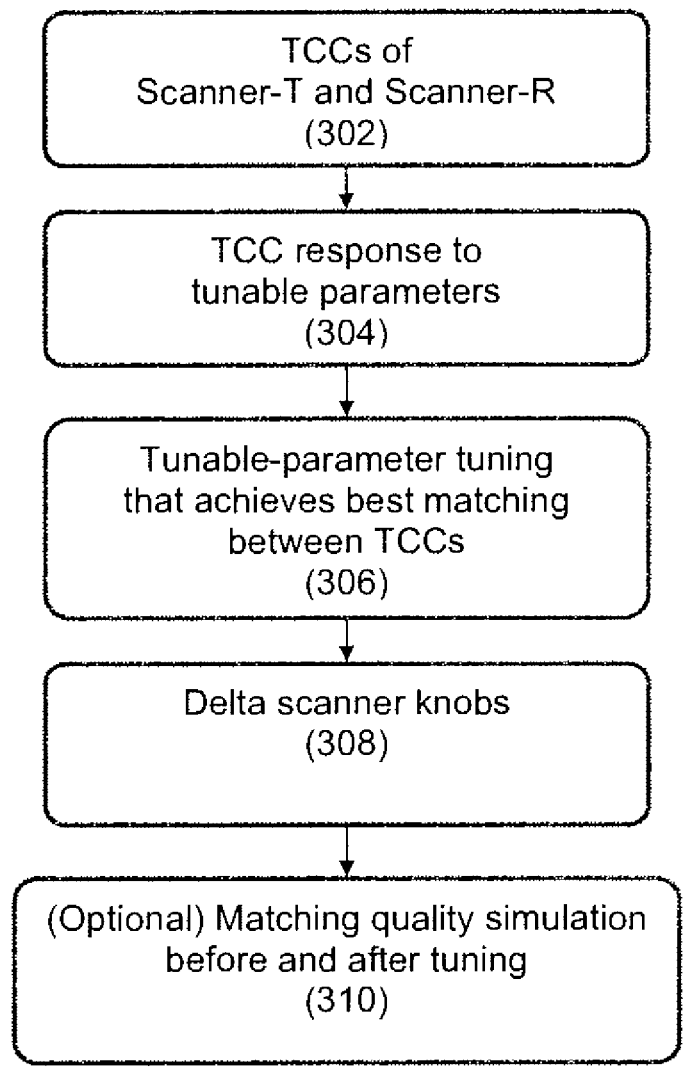
FIG. 3 is a flow diagram for model-based pattern-independent TCC matching according to embodiments of the invention.

FIG. 3 is a diagram illustrating an example flow of performing model-based pattern-independent TCC matching according to embodiments of the invention.

Referring to the discussion above, notice that aerial image intensity only depends on the mask image and the TCCs, so the TCCs capture all the optical characteristics of a scanner. If two models have the same TCCs, then the aerial images from the two models will match perfectly for the same mask. If the resist parts of the models are also the same, then the printing results also match perfectly.

In particular, for two models represented by different TCCs: $TCC_T$ and $TCC_R$ (representing Model-T and Model-R, respectively, step 302 in FIG. 3), their AI intensity difference $\Delta I$ is given by:

$$\Delta I(x) = \sum_{k'}\sum_{k''} TCC_T(k', k'')M(k')M*(k'')\exp(-j(k'-k'')x) -$$
$$\sum_{k'}\sum_{k''} TCC_R(k', k'')M(k')M*(k'')\exp(-j(k'-k'')x)$$
$$= \sum_{k'}\sum_{k''} (TCC_T(k', k'') - TCC_R(k', k''))M(k')M*$$
$$(k'')\exp(-j(k'-k'')x)$$

Therefore, the AI intensity difference is strongly correlated with the difference between the two TCCs. As should be apparent, if the difference between TCCs is 0, then the aerial images are exactly the same, irrespective of mask patterns. If the TCC difference is small enough, then the aerial image difference is also small, for any mask pattern.

In particular, the RMS difference in AI intensities in the frequency domain can be computed as $$\sum_{k'}\sum_{k''} |M(k')M(k'')|^2 |TCC_T(k',k'') - TCC_R(k',k'')|^2$$

Based on this observation, one embodiment of the present invention is to minimize the differences between the TCCs in pattern-independent matching/tuning.

Again, embodiments of the invention use RMS values as a measurement of the TCC difference, more specifically, the TCC difference between $TCC_T$ and $TCC_R$ in RMS is:

$$\Delta TCC_{RMS} = \|TCC_T - TCC_R\|^2 = \sum_{k'}\sum_{k''} |TCC_T(k',k'') - TCC_R(k',k'')|^2$$

Parameter Adjustments to Minimize TCC Difference

Suppose there are N adjustable knobs to manipulate $TCC_T$, the readings of these N knobs are $K_1, K_2, \ldots, K_N$, and the resulting $TCC_T$ is denoted as $TCC_T(K_1, K_2, \ldots, K_N)$. The matching/tuning problem can be mathematically described as finding the optimal values $(K_1, K_2, \ldots, K_N)$ to minimize $$\|TCC_T(K_1, K_2, \ldots, K_N) - TCC_R\|^2$$

The present inventors recognize that the general field of multi-dimensional non-linear optimization can be applied to this problem. Thus a number of known methods in this field can be employed, including, for example, Newton's method (also known as Newton-Raphson method or Newton-Fourier method), Gaussian-Newton algorithm, Levenberg-Marquardt algorithm, etc.

Parameter Adjustments to Minimize TCC Difference: Method of Least Square/Quadratic Programming Solver The present inventors further recognize that when the knobs' effects on $TCC_T$ are purely linear, or the knobs' tuning amounts are small so that their effects have good linear approximations, then the problem can be solved using a least squares method or a quadratic programming solver with much lower computational cost than the non-linear optimization methods mentioned above.

More specifically, assuming that at "nominal" knob setting, the knobs' readings are $K_{10}, K_{20}, \ldots, K_{N0}$, and the derivative of $TCC_T$ with respect to knob i is $\Delta_i TCC_T$, (step 304 in FIG. 3), i.e., $$TCC_T(K_{10}, K_{20}, \ldots, K_i, \ldots, K_{N0}) - TCC_T(K_{10}, K_{20}, \ldots, K_{i0}, \ldots, K_{N0}) = \Delta_i TCC_T(K_i - K_{i0}) \quad \text{(Eq. 3)}$$

then since the relationship between $TCC_T$ and knobs is linear, $$TCC_T(K_1, K_2, \ldots, K_N) = \quad \text{(Eq. 4)}$$
$$TCC_T(K_{10}, K_{20}, \ldots, K_{N0}) + \sum_{i=1}^{N} \Delta_i TCC_T(K_i - K_{i0})$$

And $$\|TCC_T(K_1, K_2, \ldots, K_N) - TCC_R\|^2 =$$
$$\left\| TCC_T(K_{10}, K_{20}, \ldots, K_{N0}) + \sum_{i=1}^{N} \Delta_i TCC_T(K_i - K_{i0}) - TCC_R \right\|^2$$

The process then takes partial derivatives with respect to $K_1, K_2, \ldots, K_N$ and sets them to 0. More particularly, there are N linear equations of the form:

$$\sum_j \left( TCC_{T,j}(K_{10}, K_{20}, \ldots, K_{N0}) + \sum_{i=1}^{N} \Delta_i TCC_{T,j}(K_i - K_{i0}) - TCC_{R,j} \right)$$
$$\Delta_i TCC_{T,k} = 0$$

Where $k=1, \ldots N$ and j is the index for TCC matrix elements (for example $TCC_{Rj}$ represents the j-th matrix element of $TCC_R$).

Note that these N linear equations have N unknowns $K_1, K_2, \ldots, K_N$. By solving them using well-known techniques such as, but not limited to, the Gaussian elimination method, LU decomposition, etc., (step 306 in FIG. 3), the process obtains the optimal tuning amounts (i.e. $K_i - K_{i0}$) for the i=1 to N knobs (step 308 in FIG. 3). Note that $TCC_T$ and $TCC_R$ are computed using, e.g. (Eq. 2) in step 302, where $\Delta_i TCC_T$ can be determined using a finite difference method, as shown in (Eq. 3). If there are other constraints such as tuning amount limits, then these constraints can be incorporated in the optimization and solved using a quadratic programming solver.

Finally in step 310, in some embodiments, simulations are run to determine the performance improvement that results from the tuning. For example, the step includes comparing the CD difference between the reference model and the un-tuned model, and the CD difference between the reference model and the tuned model to determine whether there is a substantial reduction. Alternatively, the step includes comparing the ΔI difference or TCC difference.

Reduce Dimension of Optimization

If there are many tunable knobs (e.g. a number of knobs comparable to the number of TCC elements), then it is possible to tune to reduce the TCC difference to a small value and to thereby achieve generic, pattern-independent matching. However, for 2D mask images, TCC is a 4-dimensional matrix. In order to capture the lithography system's behavior adequately, the number of TCC elements is typically very high (millions or even more), while the typical number of knobs is at most thousands. The enormously high TCC-element-number to knob-number ratio makes it very difficult to achieve significant residual error reduction in practice, and things can be made worse with possible numerical error.

As a result, it may be necessary to reduce the dimension of optimization (i.e. number of TCC elements in this case) with a limited number of knobs.

1D TCC

For a 2D mask image having a Fourier Transform representation of $M(k_1, k_2)$, the complete aerial image can be expressed as $$I(x, y) = \sum_{(k'_1, k'_2, k''_1, k''_2)} TCC(k'_1, k'_2, k''_1, k''_2)$$

$$M(k'_1, k'_2)M*(k''_1, k''_2)\exp(-j(k'_1-k''_1)x - j(k'_2-k''_2)y)$$

Now consider a 1D (e.g. vertical) mask. Its frequency domain representation $M(k_1, k_2)$ is $M_X(k_1)\delta(k_2)$, where $\delta(k_2)$ is the Dirac-function. For this mask image, the aerial image intensity is computed as:

$$I(x, y) = \sum_{(k'_1, k''_1)} TCC(k'_1, 0, k''_1, 0)M_x(k'_1)M_x^*(k''_1)\exp(-j(k'_1-k''_2)x)$$

As expected, the aerial image intensity does not depend on y components. Further, $TCC(k'_1,0,k''_1,0)$ with much fewer terms captures all the system response to 1D vertical mask patterns. Similarly, the system response to 1D horizontal patterns is fully encapsulated in $TCC(0,k'_2,0,k''_2)$ 1D TCC-Based Matching and Tuning Since 1D TCCs (both horizontal and vertical) completely describe the transformation from 1D mask images to aerial images, if the 1D TCC difference (in RMS) can be reduced to a small amount, then the aerial image, and thus the printing result difference for 1D mask patterns, will also shrink to a small amount.

In addition, the present inventors recognize that typical 2D mask images have most energy concentrated around the x-axis and y-axis in the frequency domain. This fact can also be understood as a consequence of the Manhattan nature of mask geometries. For example, one can do a SVD (Singular Value Decomposition) of the mask image, i.e., express $M(k_1, k_2)$ as a sum of products of 1D vertical and 1D horizontal images, i.e., $$M(k_1, k_2) = \sum_i M_{X,i}(k_1)M_{Y,i}(k_2).$$

Typically, the DC (zero-frequency) component for either $M_{X,i}$ or $M_{Y,i}$ would dominate all the AC (non-zero-frequency) components. So when one looks at the mask image in the frequency domain, it should indeed have most of the energy near the x- and y-axes. Further, due to the smoothness of the TCCs, once the 1D TCCs are matched, the two TCCs are also well matched for near-1D components.

Pattern-Independent Matching and Tuning Based on 1D TCC

Consequently, in embodiments, the process minimizes the difference in RMS between the 1D TCCs of two models to achieve matching and tuning (steps 302 to 308 in FIG. 3). This methodology achieves pattern-independent matching and tuning for typical masks handled in the semiconductor industry. With it, one can perform matching and tuning without any knowledge of the mask. In addition, since the number of elements in 1D TCCs is in the thousands, which is much less than the total number of elements in a full (i.e. "raw") TCC, 1D TCCs are easier to be tuned than the full TCCs.

The mathematical description of 1D TCC difference minimization is exactly the same as that of TCC difference minimization, except for the elements in the summation, more specifically, the object function to be minimized is:

$$\Delta TCC\_1D_{RMS} = \|TCC\_1D_T - TCC\_1D_R\|^2$$

$$= \sum_{(k'_1,k'_2,k''_1,k''_2):k'_1=k''_1=0 \text{ or } k'_1=k''_1=0}$$

$$|TCC_T(k'_1, k'_2, k''_1, k''_2) - TCC_R(k'_1, k'_2, k''_1, k''_2)|^2$$

The algorithms to minimize 1D TCC difference are also the same as those to minimize TCC difference. One only needs to replace the TCCs by the corresponding 1D TCCs in the formulas used in steps 302 to 308 above, and solve them simultaneously for both dimensions as described above.

Weighted Matching and Tuning

In the discussions above, all elements in TCC (or 1D TCC) are treated equally. However, in some applications, it may be preferable to emphasize certain elements. For example, suppose the most critical pitch in the mask is known, then it may be preferable to minimize the element difference corresponding to this pitch. Suppose a weight assignment for TCC element $TCC(k'_1,k'_2,k''_1,k''_2)$ is given by $W(k'_1,k'_2,k''_1,k''_2)$, then the object function for a weighted TCC difference minimization is:

$$\Delta WTCC_{RMS} = \|W \cdot (TCC_T - TCC_R)\|^2 \quad \text{(Eq. 5)}$$

$$= \sum_{(k'_1,k'_2,k''_1,k''_2)} [W(k'_1, k'_2, k''_1, k''_2)$$

$$|TCC_T(k'_1, k'_2, k''_1, k''_2) - TCC_R(k'_1, k'_2, k''_1, k''_2)|^2]$$

The object function for weighted 1D TCC difference minimization is similar.

Some Possible Weight Assignments

It should be noted that Eq. 1 provides the most general form for weighted matching/tuning. The weighting schemes described below are provided as example applications of this general form and are not meant to be exhaustive. Those skilled in the art will appreciate other weighting schemes that can be used after being taught by these examples.

For example, note that unweighted 1D TCC difference minimization can also be viewed as a weighted TCC difference minimization with $$W(k'_1, k'_2, k''_1, k''_2) = \begin{cases} 1 & k'_2 = k''_2 = 0 \text{ or } k'_1 = k''_1 = 0 \\ 0 & \text{otherwise} \end{cases}$$

This weight assignment relies on few assumptions about the mask patterns.

In another example, the weight for the TCC's DC (zero-frequency) component is increased because, in the mask image, the DC element typically has the most energy concentration. Thus, the following weight scheme is assigned:

$$W(k'_1, k'_2, k''_1, k''_2) = \begin{cases} W > 1 & k'_2 = k''_2 = k'_1 = k''_1 = 0 \\ 1 & k'_2 = k''_2 = 0 \text{ or } k'_1 = k''_1 = 0 \\ & \text{but } k'_1 k''_1 \neq 0 \\ c \ll 1 & \text{otherwise} \end{cases}$$

Here, W is a constant weight assigned to the TCC's DC component. It is larger than 1 to increase the DC component's weight in optimization. c is a constant weight assigned to all non-1D TCC components. It is much smaller than 1 or even zero so that the focus is on minimizing the difference between 1D TCC components. For example, W=15 and c=0.01 leads to excellent results in simulations performed by the present inventors.

In a third example, the object is to increase the weights for some 2D TCC components for mask layouts with more significant 2D elements (for example, contact layer), but still (almost) retain the 1D TCC's matching/tuning performance. In this example, the following weight scheme is assigned:

$$W(k'_1, k'_2, k''_1, k''_2) = \begin{cases} W > 1 & k'_2 = k''_2 = k'_1 = k''_1 = 0 \\ 1 & k'_2 = k''_2 = 0 \text{ or } k'_1 = k''_1 = 0 \\ & \text{but } k'_1 k''_1 \neq 0 \\ c_{2D} & k'_1 = k'_2 \text{ or } k''_1 = k''_2 \\ & \text{but } k'_1 k''_1 \neq 0 \\ c \ll 1 & \text{otherwise} \end{cases}$$

Compared to the previous example, it can be seen that a weight $c_{2D}$ is now assigned to certain 2D TCC components. Typically, a number close to 1 for $c_{2D}$ is chosen, so the weights for those mask elements with $k_1 = k_2$ of a mask image $M(k_1, k_2)$ are increased. The mask elements that have higher weights are 1D elements plus the elements with $k_1 = k_2$. The shape of these elements resemble a British flag, thus this weighting scheme is referred to as the "union jack" scheme.

In further examples, if the mask information is known, then it can be included as a weight in the optimization. More specifically, as was shown above, the difference for aerial image intensity in the frequency domain can be described as $$\sum_{k'_1, k'_2, k''_1, k''_2} |M(k'_1, k'_2) M(k''_1, k''_2)|^2$$

$$|TCC_T(k'_1, k'_2, k''_1, k''_2) - TCC_R(k'_1, k'_2, k''_1, k''_2)|^2.$$

In this formulation, one can view $$W(k'_1, k'_2, k''_1, k''_2) = |M(k'_1, k'_2) M(k''_1, k''_2)|^2$$

as the weight. Minimizing this weighted object function should lead to better matching/tuning results for this specific mask Hybrid Matching and Tuning Based on the foregoing observations, for certain applications, it may be preferable to use weighting to place higher priority on certain patterns, such as gates or hot spots (e.g. patterns with line-end pull-back or push-out, bridging or necking, line edge roughness, and missing or extra patterns). However, this may be difficult to achieve if the process only relies on TCCs. For such applications, the present inventors recognize that TCC-based matching and tuning can be accompanied by contour matching. For example, one can reduce the CD difference for certain gauges (e.g., critical patterns such as gates, generic gauges, or hot spots) as well as the TCC difference simultaneously or sequentially.

Figure 4:
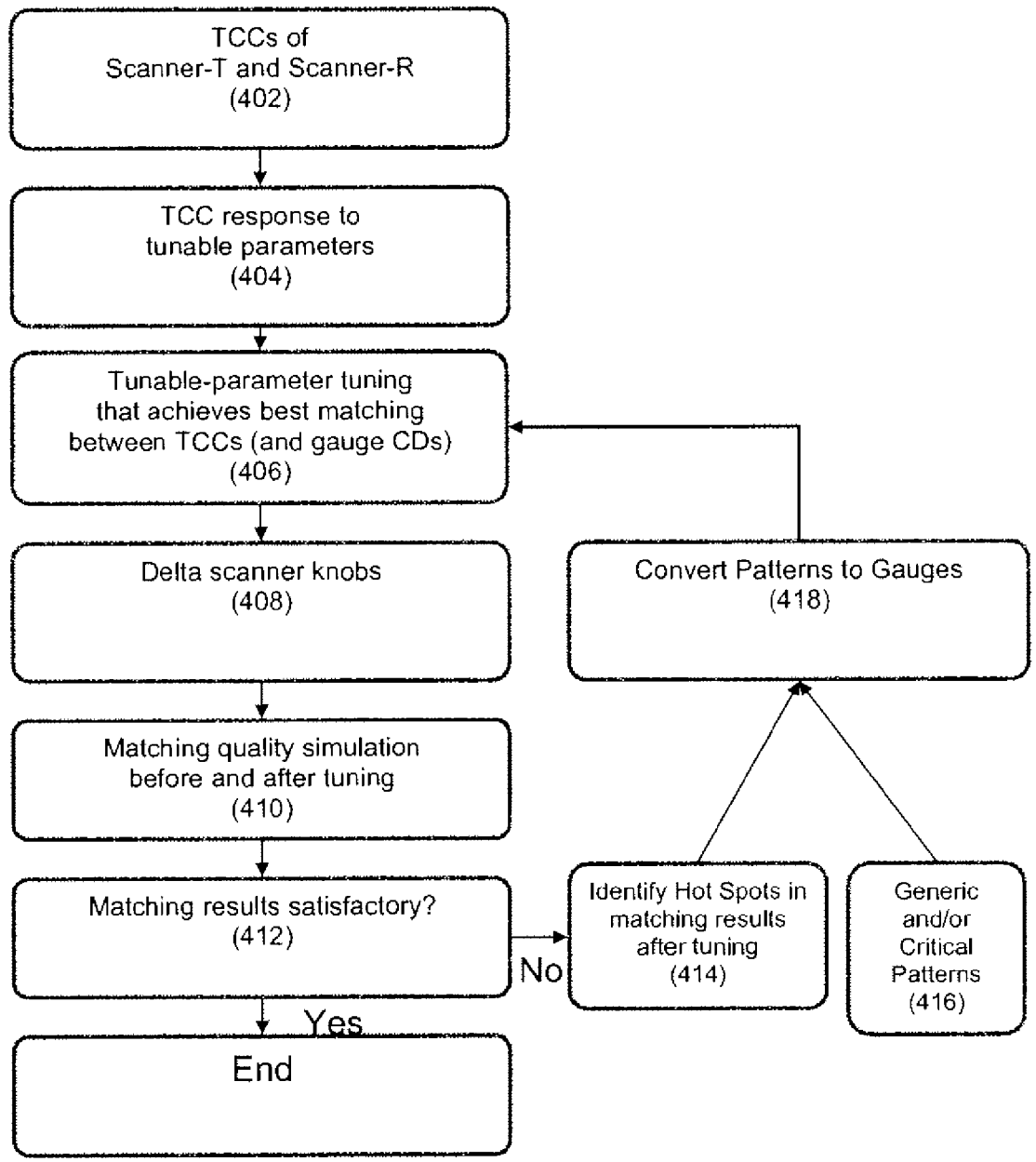
FIG. 4 is a flow diagram for model-based hybrid TCC and CD matching according to embodiments of the invention.

FIG. 4 is a diagram illustrating an example flow of performing model-based hybrid TCC and CD matching according to other embodiments of the invention.

If CD difference and TCC difference is jointly optimized, one can specify different weights for CDs and TCC elements, similar to assigning weights in weighted TCC-based matching and tuning as mentioned above. More specifically, the object function becomes $$\Delta HYBRID_{RMS} = \left\| W_{CD} \cdot (\overrightarrow{CD_T} - \overrightarrow{CD_R}) \right\|^2 +$$
$$\left\| W_{TCC} \cdot (TCC_T - TCC_R) \right\|^2$$
$$= \sum_i [W_{CD}(i) |CD_T(i) - CD_R(i)|^2] +$$
$$\sum_{k'_1, k'_2, k''_1, k''_2} [W_{TCC}(k'_1, k'_2, k''_1, k''_2) |TCC_T(k'_1, k'_2, k''_1, k''_2) -$$
$$TCC_R(k'_1, k'_2, k''_1, k''_2)|^2]$$

where $CD_T(i)$ and $CD_R(i)$ are CDs of the i-th gauge corresponding to Model-T and Model-R, respectively; and $W_{CD}(.)$ and $W_{TCC}(.)$ are constant weights for CDs and TCC elements, respectively. The weights specify the trade-off between optimizing for certain gauges (i.e. pattern contours) and optimizing for general patterns. CDs for use in these embodiments are obtained by wafer measurements or simulations using Model-T and Model-R. Derivative CDs with respect to knob tuning amount can be computed in the same way, through wafer measurements or simulations using Model-T and Model-R. But if there are many knobs, then simulation is typically the most cost-efficient. Those skilled in the art will appreciate that the identification of the optimal tuning amount is a straightforward process, and is similar to finding the optimal tuning amount for the object function with TCC only (Eq. 4).

The hybrid optimization can also be done sequentially, in which the process first minimizes the TCC difference alone as in the previously-described embodiments. For example, as shown in FIG. 4, steps 402 to 410 can be performed in similar manner as steps 302 to 310 as described in connection with FIG. 3. If the remaining difference after TCC-difference-minimization is small enough (as determined in step 412), then the process simply applies the TCC-based tuning amounts, since it's good enough for all possible patterns. Otherwise, if the remaining difference is still significant (i.e., it may be impossible to achieve across the board improvement for all patterns with current knobs), the process enters a hybrid matching loop. In this loop, the process will identify gauges (step 418) to use for CD optimization using the hybrid equation above. As shown in FIG. 4, the gauges can be identified either from critical patterns (step 416) or hot spots (step 414). In embodiments, gauges are identified from critical patterns (step 416), e.g. gates or dense patterns. Gauges are identified from hot spots (step 414), e.g. bridging, necking, edge roughness defects, etc.

In either event, the gauges are then included in the optimizing step 406, using the hybrid process described above. This loop can be iterated until the process achieves a satisfactory tuning results or the maximum number of iterations is hit as determined in step 412.

Application I: Scanner Matching

With two different Scanners, it is desired to tune one scanner (Scanner-T, which stands for Scanner-to-be-Tuned) to mimic the behavior of the other (Scanner-R, which stands for Scanner-Reference). Assume that Model-T and Model-R respectively describe Scanner-T's and Scanner-R's behavior accurately. Then by applying the TCC-based pattern-independent matching method, one will be able to reduce the difference between Model-T and Model-R, and thus achieve matching between Scanner-T and Scanner-R. Further, one can add CDs of selected gauges in the joint hybrid optimization.

Application II: Model Tuning

In this application, the aim is to tune one scanner (Scanner-T) toward a lithography model (Model-R). For example, there may be some process variation during lithography, and it is desired to correct or compensate such variation by tuning the scanner back to its original model. Model-R can be viewed as a virtual scanner and it represents the desired scanner behavior. Assume that Model-T describes Scanner-T's behavior accurately. Again, by applying the TCC-based pattern-independent matching method, one will be able to reduce the difference between Model-T and Model-R, and thus achieve the desired printing results for Scanner-T. Further, one can add CDs of selected gauges in the joint hybrid optimization.

Figure 5:
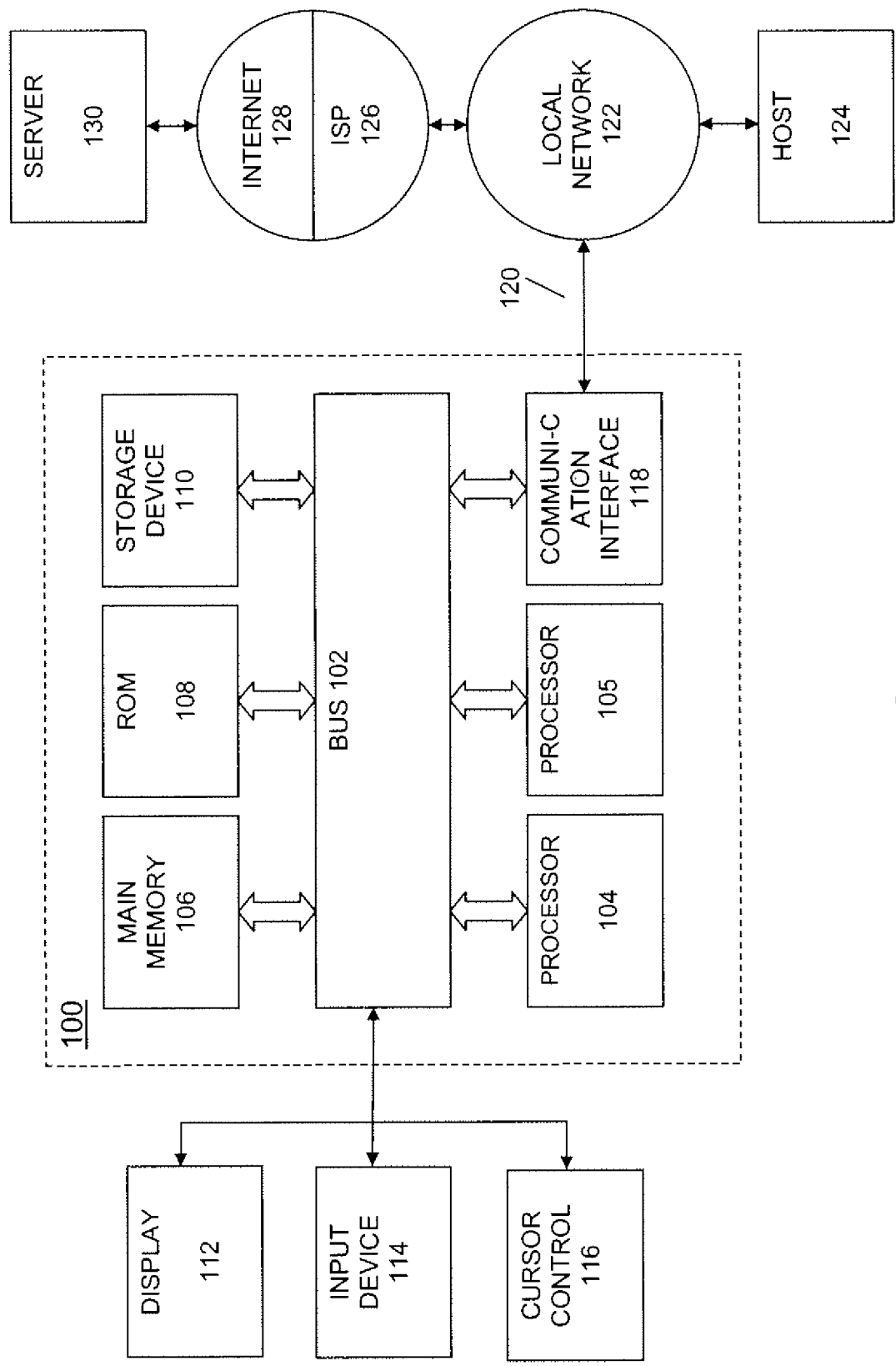
FIG. 5 is a block diagram that illustrates a computer system which can assist in the implementation of the method of the present invention.

FIG. 5 is an exemplary block diagram that illustrates a computer system 100 which can assist in the scanner matching and tuning methods disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media. Non-volatile media include, for example, optical or magnetic disks, such as storage device 110. Volatile media include dynamic memory, such as main memory 106. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 6:
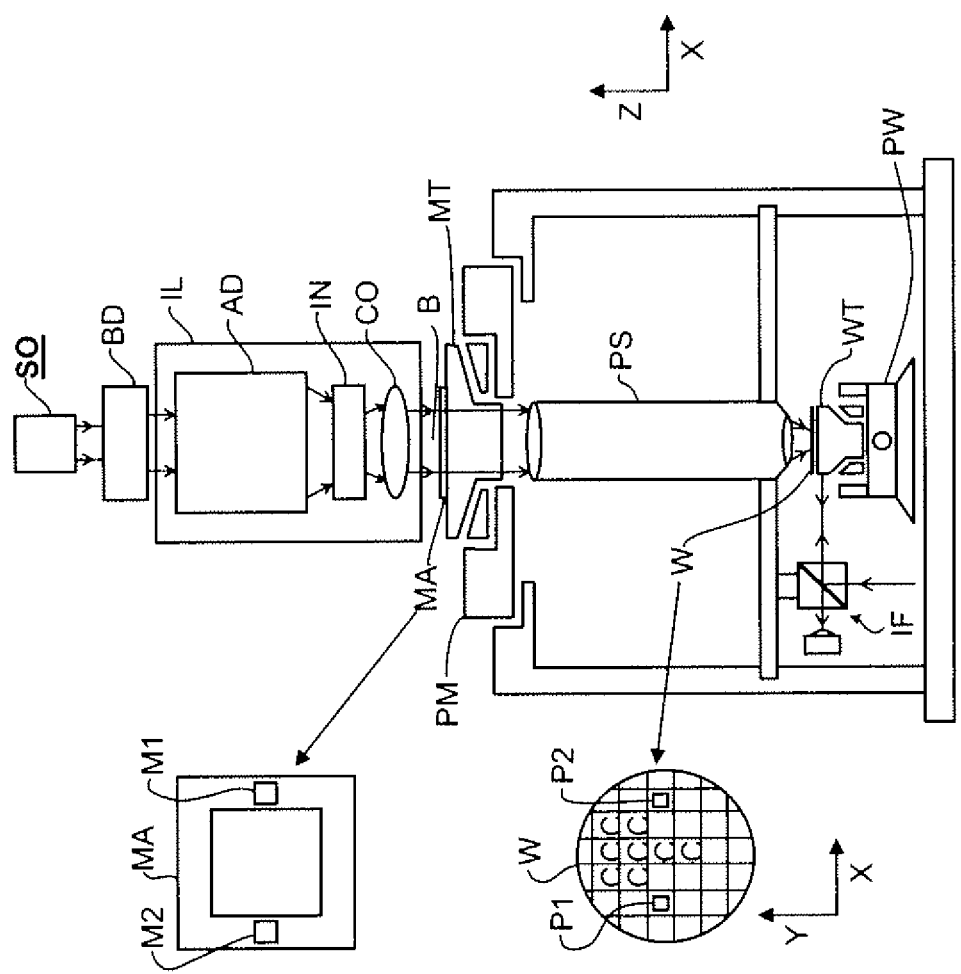
FIG. 6 schematically depicts a lithographic projection apparatus suitable for use with the method of the present invention.

FIG. 6 schematically depicts an exemplary lithographic projection apparatus whose performance could be simulated and/or optimized utilizing the processes of present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 6 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 6. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope of the invention.

What is claimed is:

1. A computer-implemented method of tuning a to-be-tuned lithographic process to a reference lithographic process, comprising:
    obtaining respective lithographic process models for both the reference lithographic process and the to-be-tuned lithographic process;
    identifying a set of tunable parameters of the to-be-tuned lithographic process, wherein the tunable parameters are distinct and independent from patterns on a design layout to be imaged using the to-be-tuned lithographic process;
    determining responses of the to-be-tuned lithographic process model to changes in the set of tunable parameters;
    determining optimal changes in the tunable parameters that cause the lithographic process models to match, wherein the step of determining optimal changes includes applying non-uniform weights to different terms on the lithographic process models; and
    adjusting the model for the to-be-tuned lithographic process based on the determined optimal changes,
    wherein one or more of the obtaining, identifying, determining responses, determining optimal changes, and adjusting steps are implemented by the computer.

2. The method according to claim 1, wherein the step of determining optimal changes includes identifying two substantially orthogonal components of the to-be-tuned lithographic process model, and respectively determining optimal changes for the two substantially orthogonal components.

3. The method according to claim 1, wherein the non-uniform weights are based on characteristics of the design layout to be imaged using the lithographic processes.

4. The method according to claim 1, wherein the step of determining optimal changes includes jointly optimizing contours of certain patterns on the design layout to be imaged using the lithographic processes.

5. The method according to claim 4, wherein the jointly optimizing includes optimizing critical dimensions of the certain patterns.

6. The method according to claim 1, wherein the lithographic process models comprise transmission cross-coefficients (TCCs).

7. The method according to claim 6, wherein the step of determining optimal changes includes minimizing an RMS error between TCCs of the lithographic process models.

8. The method according to claim 1, wherein the lithographic process models capture substantially all the optical characteristics of the respective lithographic processes.

9. The method according to claim 1, wherein the tunable parameters correspond to settings of a photolithographic process performed by the lithographic processes.

10. A computer program product comprising a non-transitory computer readable medium having instructions recorded thereon, the instructions when executed by a computer implementing a method of tuning a to-be-tuned lithographic process to a reference lithographic process, the method comprising:
    obtaining respective lithographic process models for both the reference lithographic process and the to-be-tuned lithographic process;
    identifying a set of tunable parameters of the to-be-tuned lithographic process, wherein the tunable parameters are distinct and independent from patterns on a design layout to be imaged using the to-be-tuned lithographic process;
    determining responses of the to-be-tuned lithographic process model to changes in the set of tunable parameters;
    determining optimal changes in the tunable parameters that cause the lithographic process models to match, wherein the step of determining optimal changes includes applying non-uniform weights to different terms on the lithographic process models; and
    adjusting the model for the to-be-tuned lithographic process based on the determined optimal changes.

11. The computer program product according to claim 10, wherein the step of determining optimal changes includes respectively determining optimal changes in two substantially orthogonal directions corresponding to orientation of features in a mask image used in the lithographic processes.

12. The computer program product according to claim 10, wherein the non-uniform weights are based on characteristics of the design layout to be imaged using the lithographic processes.

13. The computer program product according to claim 10, wherein the step of determining optimal changes includes jointly optimizing contours of certain patterns on the design layout to be imaged using the lithographic processes.

14. The computer program product according to claim 13, wherein the jointly optimizing includes optimizing critical dimensions of the certain patterns.

15. The computer program product according to claim 10, wherein the lithographic process models comprise transmission cross-coefficients (TCCs).

16. The computer program product according to claim 15, wherein the step of determining optimal changes includes minimizing an RMS error between TCCs of the lithographic process models.

17. The computer program product according to claim 10, wherein the lithographic process models capture substantially all the optical characteristics of the respective lithographic processes.

18. The computer program product according to claim 10, wherein the tunable parameters correspond to settings of a photolithographic process performed by the lithographic processes.

* * * * *